US007989709B2

(12) United States Patent
Tsao

(10) Patent No.: US 7,989,709 B2
(45) Date of Patent: Aug. 2, 2011

(54) FLEXIBLE SHEET WITH ELECTRICAL CONNECTING LOCATIONS ENGAGING THROUGH HOLES IN A RIGID SUBSTRATE

(75) Inventor: Chang-Wei Tsao, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 375 days.

(21) Appl. No.: 12/393,152

(22) Filed: Feb. 26, 2009

(65) Prior Publication Data
US 2010/0091468 A1   Apr. 15, 2010

(30) Foreign Application Priority Data

Oct. 10, 2008   (CN) .......................... 2008 1 0304860

(51) Int. Cl.
H05K 1/00 (2006.01)
H01R 12/00 (2006.01)
(52) U.S. Cl. ........................................ 174/264; 439/62
(58) Field of Classification Search .................. 174/254, 174/255, 250; 361/204, 909, 240, 754; 439/62
See application file for complete search history.

(56) References Cited

U.S. PATENT DOCUMENTS

| 4,812,135 | A  | * | 3/1989 | Smith ........................... 439/493 |
| 5,161,986 | A  | * | 11/1992 | Gulbranson et al. ............. 439/92 |
| 6,077,124 | A  | * | 6/2000 | Etters et al. ..................... 439/632 |
| 6,444,921 | B1 | * | 9/2002 | Wang et al. ..................... 174/260 |
| 6,997,720 | B2 | * | 2/2006 | Perret et al. ...................... 439/67 |
| 7,717,715 | B2 | * | 5/2010 | Grover et al. .................... 439/62 |
| 7,753,688 | B1 | * | 7/2010 | Everson et al. .................. 439/61 |
| 2002/0123259 | A1 | * | 9/2002 | Yatskov et al. ............... 439/329 |
| 2008/0047737 | A1 | * | 2/2008 | Sahara et al. .................. 174/254 |
| 2008/0105456 | A1 | * | 5/2008 | Kawaguchi et al. .......... 174/255 |
| 2008/0107802 | A1 | * | 5/2008 | Kawaguchi et al. ......... 427/97.2 |
| 2009/0014205 | A1 | * | 1/2009 | Kobayashi et al. ........... 174/255 |

* cited by examiner

Primary Examiner — Chandrika Prasad
(74) Attorney, Agent, or Firm — Steven M. Reiss

(57) ABSTRACT

A flexible printed circuit board includes a flexible sheet and a rigid substrate attached to the flexible printed circuit board. The flexible printed circuit board includes a first surface and an opposite second surface. A number of electrical connecting locations are defined on the first surface of the flexible printed circuit. The rigid substrate includes a third surface and an opposite fourth surface and is disposed on the flexible sheet with the fourth surface contacting the first surface of flexible sheet. The rigid substrate defines a number of through holes corresponding to the electrical connecting location to allow the electronic components to pass through.

17 Claims, 3 Drawing Sheets

FLEXIBLE SHEET WITH ELECTRICAL CONNECTING LOCATIONS ENGAGING THROUGH HOLES IN A RIGID SUBSTRATE

BACKGROUND

1. Technical Field

The present disclosure relates to printed circuit boards (PCBs) and, particularly, to a flexible printed circuit board (FPC) which can be coupled to a rigid PCB using surface-mount technology (SMT).

2. Description of Related Art

FPCs are widely used in board-to-board or chip-to-board connections in electronic devices which require multi-dimension electrical connections, utilizing the flexibility of the FPCs Generally, the FPCs are connected to a rigid main board by a connector or by a process of thermal compression bonding. However, the use of the connector increases the volume and cost of electronic devices. The process of thermal compression bonding requires manual operation, decreasing the efficiency of assembly of electronic devices.

To overcome the defects of above-mentioned methods, SMT is also considered. Commonly, if SMT is applied, the FPCs need to be packed up as tape and positioned to desired locations of the rigid main board using a vacuum sucker. However, it is difficult to pack and precisely position the FPCs because the FPCs are flexible.

Therefore, there is room for improvement within the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Figure 1:
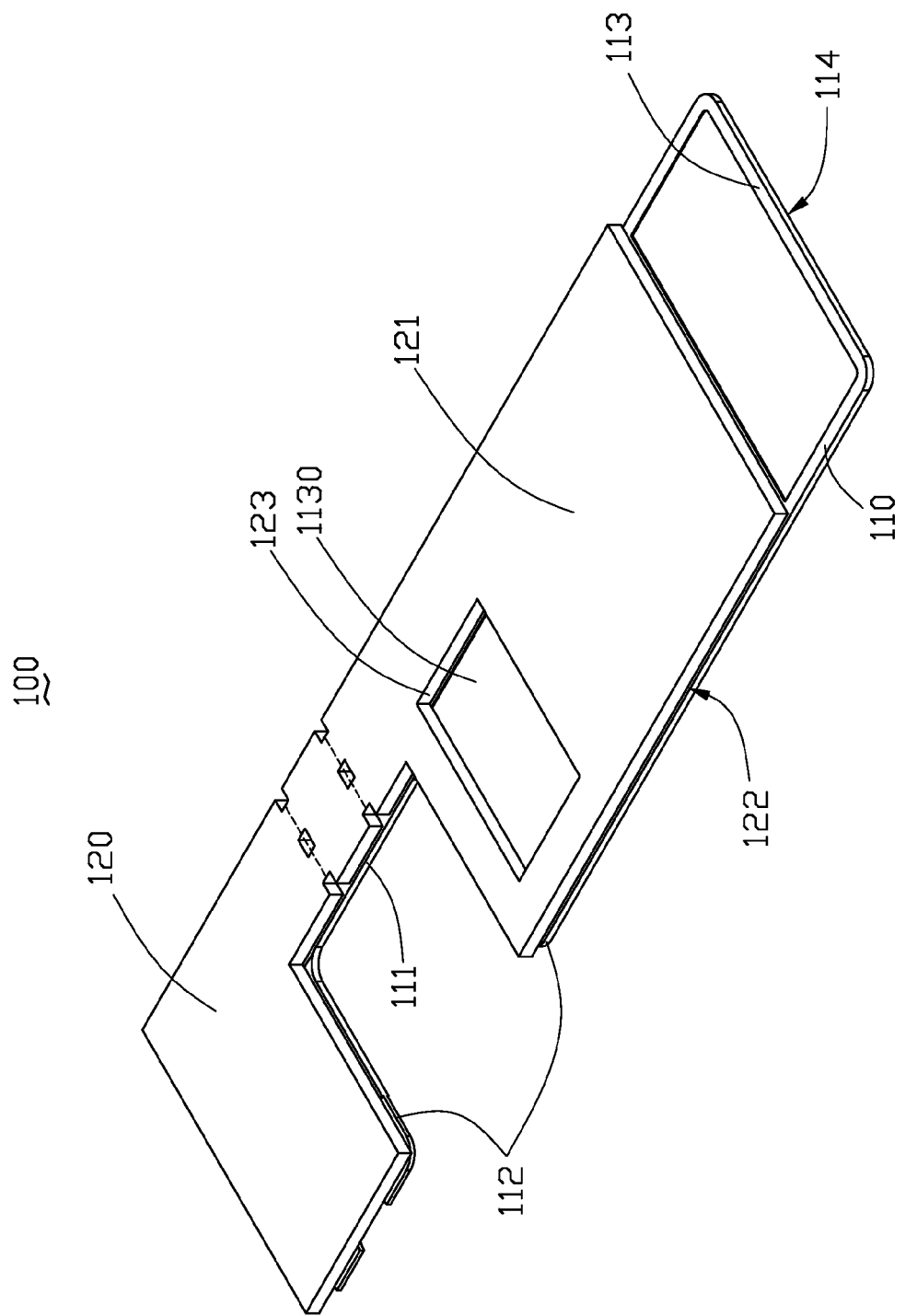
FIG. 1 is a schematic view of an FPC in accordance with one embodiment.
Figure 2:
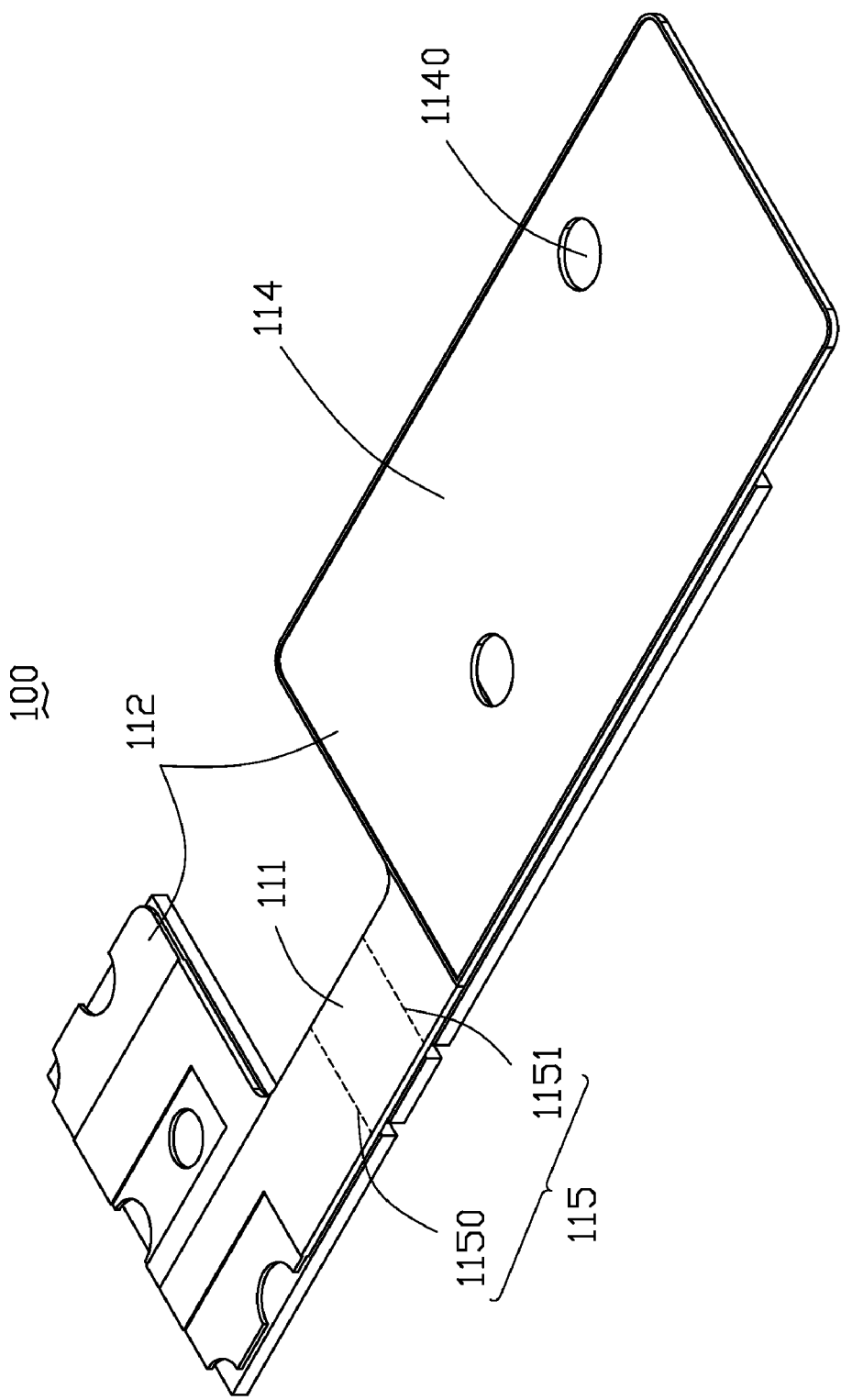
FIG. 2 is a schematic view of the FPC of FIG. 1 viewed at another angle.
Figure 3:
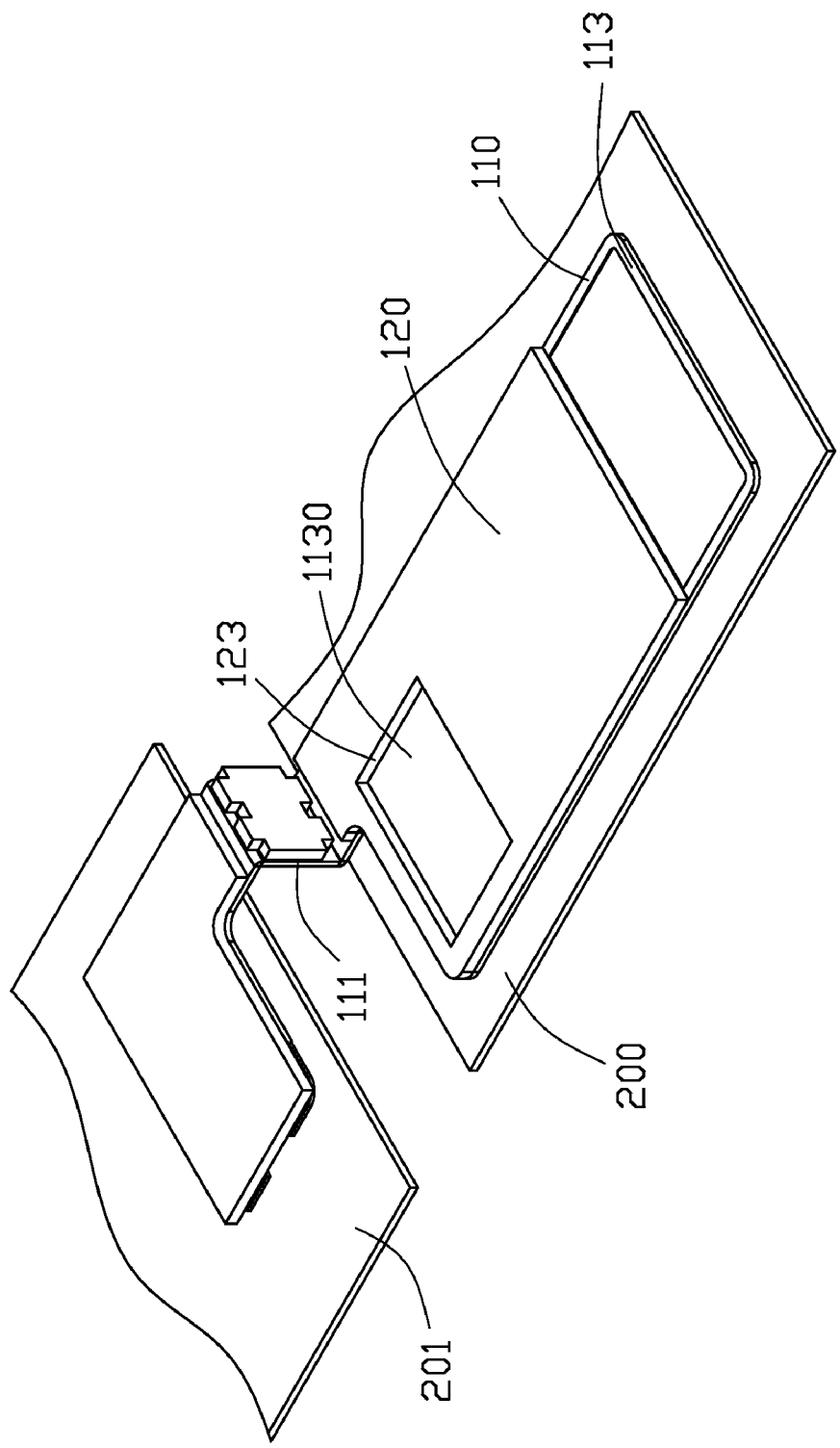
FIG. 3 is a schematic, assembled view of the FPC of FIG. 1.

An FPC 100 includes a flexible sheet 110 and a rigid substrate 120. The flexible sheet 110 is wired and configured for electrically connecting to a main board 200. The rigid substrate 120 is attached to the flexible sheet 110 and configured for enhancing operability of the FPC 100 in SMT.

For purpose of illustration only, the flexible sheet 110 includes a bendable portion 111, a first surface 113, and an opposite second surface 114. The flexible sheet 110 also includes two connecting portions 112 interconnected by the bendable portion 111. The bendable portion 111 has two seams 115: a first seam 1150 and a second seam 1151. In this embodiment, the bendable portion 111 and the connecting portions 112 are integral formed.

One of the connecting portions 112 is configured for electrically connecting to the main board 200. The other connecting portion 112 is configured for electrically connecting to another board 201 that often lies in a different plane than the main board 200 and is movable relative to the main board 200. For example, the FPC 100 may be applied to a flip-type or slide-type mobile phone having a main body that accommodates the main board 200 and a display body which contains the board 201.

The first surface 113 is configured for mounting electronic components (not shown). A number of electrical connecting locations 1130 are defined on the first surface 113 for mounting corresponding electronic components (not shown). The second surface 114 is configured for connecting to the main board 200. The second surface 114 defines a number of via holes 1140 for collecting tin soldering grease when performing solder printing on the second surface 114. Thus the electrical connection between the connecting portion 112 and the main board 200 can be improved after performing reflow soldering on the second surface 114.

The rigid substrate 120 includes a third surface 121 and a fourth surface 122 opposite to the third surface 121 and is disposed on the flexible sheet 110 with the fourth surface 122 in contact with the first surface 113. The rigid substrate 120 defines a number of through holes 123 corresponding to the electrical connecting locations 1130 to allow the electronic components to pass through.

Additionally, to allow the FPC to be adopted in a multi-dimensional modifiable connecting device, the FPC 100 may be bent at the seams 115. Therefore, the rigid substrate 120 may be separated into distinct, relatively moveable portions, either by making the rigid substrate into distinct and separated pieces or providing weakened bending areas. When the rigid substrate 120 is divided into distinct and separated pieces, each piece may be separately attached to flexible sheet 110.

In the present exemplary embodiment, the first seam 1150 and the second seam 1151 are two parallel straight lines. However, they are not limited by this embodiment, and can be any shape according to the shape of the main board 200 and/or specific connection requirements.

The thickness of the rigid substrate 120 may range from about 0.1 centimeter (cm) to about 0.3 cm. The rigid substrate 120 can be made of rigid material with high temperature endurance, such as polycarbonate, epoxy resin, phenol-formaldehyde resin, etc. In this embodiment, the rigid substrate 120 is made of polycarbonate.

It should be mentioned that any part of the rigid substrate 120 can be removed if a portion of the flexible sheet 110 covered by the part needs further processing.

The FPC 100 with the rigid substrate 120 is easier to be packed and positioned by the vacuum sucker, therefore is more operable in SMT processes as compared with current FPCs.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A flexible printed circuit board comprising:
   a flexible sheet having a first surface and an opposite second surface
   a plurality of electrical connecting locations defined on the first surface of the flexible sheet;
   a rigid substrate having a third surface and an opposite fourth surface, the rigid substrate attached to the flexible sheet with portions of the fourth surface contacting portions of the first surface of the flexible sheet, and;

the rigid substrate defines a plurality of through holes corresponding to the electrical connecting locations.

2. The flexible printed circuit board as claimed in claim 1, the flexible sheet comprising a bendable portion and two connecting portion, the two connecting portions interconnected by the bendable portion, and seams are formed where the connecting portions connect to the bendable portion.

3. The flexible printed circuit board as claimed in claim 2, wherein the bendable portion and the connecting portions are integrally formed.

4. The flexible printed circuit board as claimed in claim 2, wherein the rigid substrate comprises distinct, relatively moveable portions in the areas of the seams.

5. The flexible printed circuit board as claimed in claim 1, wherein the rigid substrate is comprised of a rigid material with high temperature endurance.

6. The flexible printed circuit board as claimed in claim 5, wherein the rigid material with high temperature endurance is selected from group consisting of polycarbonate, epoxy resin, and phenol-formaldehyde resin.

7. The flexible printed circuit board as claimed in claim 1, wherein the thicknesses of the rigid substrate range from about 0.1 cm to about 0.3 cm.

8. The flexible printed circuit board as claimed in claim 1, wherein the second surface defines a plurality of via holes for collecting tin soldering grease when performing solder printing on the second surface.

9. An electrical connecting structure comprising:
a main board;
a second board that lies in a different plane than the main board;
a flexible printed circuit board comprising:
a flexible sheet having a bendable portion, two connecting portions interconnected by the bendable portion, a first surface, and an opposite second surface, one of the connecting portions configured for electrically connecting to the main board, the other connecting portion is configured for electrically connecting to the second board;
a plurality of electrical connecting locations defined on the first surface of the flexible sheet;
a rigid substrate having a third surface and an opposite fourth surface, the rigid substrate attached to the flexible sheet with portions of the fourth surface contacting portions of the first surface of the flexible sheet, and;
the rigid substrate defines a plurality of through holes corresponding to the electrical connecting locations.

10. The electrical connecting structure as claimed in claim 9, the flexible sheet comprising two seams formed where the connecting portions connect to the bendable portion.

11. The electrical connecting structure as claimed in claim 9, wherein the bendable portion and the connecting portions are integrally formed.

12. The electrical connecting structure as claimed in claim 9, wherein the rigid substrate comprises distinct, relatively moveable portions in the areas of the seams.

13. The electrical connecting structure as claimed in claim 9, wherein the rigid substrate is comprised of a rigid material with high temperature endurance.

14. The electrical connecting structure as claimed in claim 13, wherein the rigid material with high temperature endurance is selected from group consisting of polycarbonate, epoxy resin, and phenol-formaldehyde resin.

15. The electrical connecting structure as claimed in claim 9, wherein the thickness of the rigid substrate range from about 0.1 cm to about 0.3 cm.

16. The electrical connecting structure as claimed in claim 9, wherein the second surface defines a plurality of via holes for collecting tin soldering grease when performing solder printing on the second surface.

17. The electrical connecting structure as claimed in claim 9, wherein the electrical connecting structure comprising at least one electronic component mounted at one of the electrical connecting locations.

* * * * *